(12) United States Patent
Sakai et al.

(10) Patent No.: US 7,936,801 B2
(45) Date of Patent: May 3, 2011

(54) TWO-DIMENSIONAL PHOTONIC CRYSTAL SURFACE EMITTING LASER LIGHT SOURCE

(75) Inventors: Kyosuke Sakai, Kyoto (JP); Eiji Miyai, Kyoto (JP); Susumu Noda, Uji (JP); Dai Ohnishi, Kyoto (JP); Wataru Kunishi, Kyoto (JP)

(73) Assignees: Kyoto University, Kyoto-Shi (JP); Rohm Co., Ltd., Kyoto-Shi (JP)

( * ) Notice: Subject to any disclaimer, the term of this patent is extended or adjusted under 35 U.S.C. 154(b) by 117 days.

(21) Appl. No.: 12/225,194

(22) PCT Filed: Mar. 20, 2007

(86) PCT No.: PCT/JP2007/000268
§ 371 (c)(1),
(2), (4) Date: Oct. 22, 2008

(87) PCT Pub. No.: WO2007/119273
PCT Pub. Date: Oct. 25, 2007

(65) Prior Publication Data
US 2009/0285255 A1    Nov. 19, 2009

(30) Foreign Application Priority Data

Mar. 20, 2006    (JP) .................................. 2006-077472

(51) Int. Cl.
*H01S 5/00*    (2006.01)
(52) U.S. Cl. .............. 372/50.124; 372/43.01; 372/50.11
(58) Field of Classification Search .............. 372/50.124
See application file for complete search history.

(56) References Cited

U.S. PATENT DOCUMENTS

| 6,853,669 B2 * | 2/2005 | Simpson et al. ................ 372/92 |
| 2003/0235229 A1 * | 12/2003 | Deng et al. ...................... 372/96 |

FOREIGN PATENT DOCUMENTS

| JP | A-2000-332351 | 11/2000 |
| JP | A-2001-308457 | 11/2001 |
| JP | A-2003-273456 | 9/2003 |

OTHER PUBLICATIONS

Sakai et al.; "Lasing Band-Edge Identification for a Surface-Emitting Photonic Crystal Laser;" *IEEE Journal on Selected Areas in Communications*; Jul. 2005; pp. 1335-1340; vol. 23, No. 7.

Ohnishi et al.; "Room temperature continuous wave operation of a surface-emitting two-dimensional photonic crystal diode laser;" *Optics Express*; Apr. 19, 2004; pp. 1562-1568; vol. 12, No. 8.

* cited by examiner

*Primary Examiner* — Minsun Harvey
*Assistant Examiner* — Xnning Niu
(74) *Attorney, Agent, or Firm* — Oliff & Berridge PLC

(57) ABSTRACT

An objective of the present invention is to provide a surface emitting laser capable of selectively generating a laser oscillation in the fundamental mode and thereby emitting a single-wavelength laser light. In a surface emitting laser including an active layer and a two-dimensional photonic crystal provided on one side of the active layer, a reflector 45 or 46 is provided at least at a portion of the circumference of the two-dimensional photonic crystal. The reflector has a reflectance distribution in which the reflectance has a maximum value at a position where the amplitude envelope of the fundamental mode of an internal resonance light created within the two-dimensional photonic crystal. This design strengthens the fundamental mode while suppressing the second mode, thus enabling the laser oscillation in the fundamental mode to be selectively obtained, so that a single-wavelength laser light can be emitted.

14 Claims, 7 Drawing Sheets

(a)

(b)

(c)

FIRST MODE — FUNDAMENTAL MODE

SECOND MODE ⎫
THIRD MODE  ⎬ HIGHER MODES
            ⎭

(a) FIRST MODE (FUNDAMENTAL MODE)

(b) SECOND MODE (HIGHER MODE)

(a) FIRST EMBODIMENT (b) SECOND EMBODIMENT

<COMPARATIVE EXAMPLE>

<COMPARATIVE EXAMPLE>

TWO-DIMENSIONAL PHOTONIC CRYSTAL SURFACE EMITTING LASER LIGHT SOURCE

TECHNICAL FIELD

The present invention relates to a two-dimensional photonic crystal surface emitting laser light source which emits laser light in a direction perpendicular to the surface of a flat light source.

BACKGROUND ART

In recent years, new types of laser light sources using a photonic crystal have been developed. A photonic crystal consists of a dielectric body material in which an artificial periodic structure is created. Usually, the periodic structure is created by providing the body material with a periodic arrangement of areas whose refractive index differs from that of the body material (this area is hereinafter called the "modified refractive index area"). The periodic structure causes a Bragg diffraction within the crystal and creates an energy band gap for the energy of light. There are two types of photonic crystal laser light sources: one utilizes a band-gap effect to make a point-like defect function as a resonator, and the other utilizes a standing wave at a band edge where the group velocity of light becomes zero. Each of these devices causes a laser oscillation by amplifying light of a predetermined wavelength.

Patent Document 1 discloses a laser light source in which a two-dimensional photonic crystal is created in the vicinity of an active layer containing a luminescent material. The two-dimensional photonic crystal includes a plate-shaped semiconductor body in which cylindrical holes are periodically arranged (e.g. in a triangular, square or hexagonal lattice pattern) so as to provide the crystal with a two-dimensional, periodic distribution of refractive index. The cycle distance is adjusted so that it equals the wavelength of light to be generated within the active layer by an injection of carriers from an electrode. As a result, a two-dimensional standing wave is produced within the two-dimensional photonic crystal, whereby the light is strengthened to produce a laser oscillation.

When the two-dimensional standing wave is produced, the light within the two-dimensional photonic crystal (this light is hereinafter called the "internal resonance light") partially leaks from the side portion of the two-dimensional photonic crystal. This leads to an energy loss and accordingly lowers the lasing efficiency. Furthermore, the leaked light is absorbed by the active layer and generates heat. These phenomena undesirably cause an increase in the minimum level of the current capable of producing the laser oscillation ("threshold gain").

Patent Document 2 discloses a two-dimensional photonic crystal surface emitting laser light source in which a member for reflecting the internal resonance light is provided around the two-dimensional photonic crystal. The document claims that this structure prevents the internal resonance light from leaking from the side portion of the two-dimensional photonic crystal and thereby improves the light use efficiency.

Patent Document 1: Japanese Unexamined Patent Application Publication No. 2000-332351 (Paragraphs [0037] through [0056] and FIG. 1)

Patent Document 2: Japanese Unexamined Patent Application Publication No. 2003-273456 (Paragraphs [0023] through [0026] and FIG. 1)

DISCLOSURE OF THE INVENTION

Problem to be Solved by the Invention

The two-dimensional photonic crystal surface emitting laser light source with the aforementioned reflecting member has the following problem.

For example, imagine the case where, as shown in FIG. 1(a), a two-dimensional photonic crystal 11 is surrounded by a rectangular reflector 12. The two-dimensional photonic crystal 11 in this example consists of a slab-shaped body material 111 in which holes 112 with a refractive index different from that of the body material 111 are arranged in a square lattice pattern. The light produced within the active layer by the injection of carriers creates a standing wave 13 whose cycle distance equals that of the holes 112 or an integer fraction thereof, as shown in FIG. 1(b). Due to the presence of the reflector 12, the standing wave 13 will have an amplitude distribution represented by an envelope having a node at the reflector 12. As shown in FIG. 1(c), the amplitude distribution has not only a fundamental mode (first mode) 141 with the envelope having only one antinode but also higher modes with multiple antinodes, such as the second mode 142, third mode 143 and so on.

Although the envelope in FIG. 1(c) is drawn in a one-dimensional form for simplicity, the amplitude envelope actually has a two-dimensional distribution since the two-dimensional photonic crystal has a two-dimensional structure. FIG. 2(a) shows an example of the two-dimensional distribution of the amplitude envelope of the first mode (fundamental mode), and FIG. 2(b) shows an example of the two-dimensional distribution of the amplitude envelope of the second mode (higher mode). In these figures, the reflector 12 is formed on the sides of a rectangle including the x and y coordinate axes.

In the two-dimensional photonic crystal surface emitting laser light source with a reflecting member described in Patent Document 2, the wavelength of the resultant laser light is basically determined by the cycle distance of the holes 112 in any mode. However, the laser light produced in each mode slightly differs in wavelength due to the difference in the cycle distance of the envelope between the modes. For example, a two-dimensional photonic crystal surface emitting laser light source with an oscillation wavelength of approximately 980 nm has an oscillation-wavelength difference in the order of 0.1 nm between the laser light generated in the fundamental mode 141 and that generated in the second mode 142. Even such a minor difference in the wavelength of the light source can cause cross talks or other problems in wavelength division multiplexing since this technique achieves the transmission of multiple sets of information by using rays of light whose wavelengths minimally differ from each other.

Thus, a problem to be solved by the present invention is to provide a two-dimensional photonic crystal surface emitting laser light source having a high light-use efficiency and being capable of emitting a single-wavelength laser light.

To solve this problem, the inventors have studied the conditions for the reflection of internal resonance light at the reflector and found that it is possible to control the polarizing direction of the laser light to be emitted. Accordingly, another problem to be solved by the present invention is to provide a two-dimensional photonic crystal surface emitting laser light source capable of emitting a laser beam suitably polarized for a light source of an optical pickup, laser processing apparatus or other devices.

Means for Solving the Problems

To solve the aforementioned problems, a two-dimensional photonic crystal surface emitting laser light source according to a first aspect of the present invention includes:
 a) an active layer;
 b) a two-dimensional photonic crystal provided on one side of the active layer; and
 c) a reflector provided at least at a portion of the circumference of the two-dimensional photonic crystal, the reflector having a reflectance distribution in which the reflectance has a maximum value at a position where an amplitude envelope of the fundamental mode of an internal resonance light created within the two-dimensional photonic crystal has a maximum value.

The reflector can be created by providing a member for reflecting the internal resonance light only at one or more sections of a line surrounding the two-dimensional photonic crystal, each section including a position where the amplitude envelope of the fundamental mode has a maximum value.

At least a portion of the reflector may be created inside the outer edge of the two-dimensional photonic crystal.

The two-dimensional photonic crystal may have an outer edge that is at least partially curved at a position other than the position where the amplitude envelope of the fundamental mode has a maximum value.

It is possible that the reflector be composed of a plurality of grooves formed parallel to the outer edge of a slab surrounding the two-dimensional photonic crystal, and the reflectance distribution be created by changing the number of the grooves.

A two-dimensional photonic crystal surface emitting laser light source according to a second aspect of the present invention includes:
 a) an active layer;
 b) a two-dimensional photonic crystal provided on one side of the active layer; and
 c) a reflector provided at least at a portion of the circumference of the two-dimensional photonic crystal, the reflector being formed so that the change in the phase of light that occurs when the light is reflected by the reflector is greater than $-0.5\pi$ and less than $0.5\pi$.

Effects of the Invention

The two-dimensional photonic crystal surface emitting laser light sources (which are hereinafter called the "surface emitting laser") according to the first and second aspects of the invention each exhibit the following effect resulting from the structure of the reflector.

(1) Surface Emitting Laser According to First Aspect of Invention

In the first aspect of the present invention, the presence of the reflector enables the surface emitting laser to improve a light use efficiency as in the case of the surface emitting laser disclosed in Patent Document 2. The reflector is designed so that its reflectance distribution has a maximum value at a position where the amplitude envelope of the fundamental mode has a maximum value. This design enables the laser oscillation in the fundamental mode to be selectively obtained, so that a single-wavelength laser light, which cannot be produced by the surface emitting laser in Patent Document 2, can be emitted.

Oscillation of higher order modes apts to be flanked by those of neighboring higher and lower modes. Therefore, the fundamental mode, i.e. the lowest order mode, is selected in the present invention.

The reflector may be provided only at one or more sections of a line surrounding the two-dimensional photonic crystal, the section including the position where the amplitude envelope of the fundamental mode has a maximum value. This design prevents the leakage of light in the fundamental mode, which has a maximum amplitude at that position, from the two-dimensional photonic crystal, while facilitating the leakage of light in the second mode, which has a maximum value at a separate position, from the two-dimensional photonic crystal. Thus, the laser oscillation in the fundamental mode can be effectively selected.

Creating at least a portion of the reflector within the two-dimensional photonic crystal enables the amplitude of the fundamental mode to be controlled without being influenced by the reflection of light that naturally occurs at the outer edge of the two-dimensional photonic crystal.

In the case where the outer edge of the two-dimensional photonic crystal is at least partially curved at a position other than the position where the amplitude envelope of the fundamental mode has a maximum value, an incident ray of light falling onto the curved portion of the outer edge within the two-dimensional photonic crystal will be reflected at an angle to the incident direction. This leads to a decrease in the reflectance in the opposite direction, so that the laser oscillation in the fundamental mode can be effectively selected.

In the case where the reflector is created by providing a plurality of grooves in a slab surrounding the two-dimensional photonic crystal, the reflectance can be controlled by varying the number of the grooves. This design enables the reflectance to be easily controlled so that it has a maximum value at the position where the amplitude envelope of the fundamental mode has a maximum value.

(2) Surface Emitting Laser According to Second Aspect of Invention

The surface emitting laser in the second aspect of the present invention can generate a laser beam that has an annular cross section with no strength at the center and is polarized from the center outwards (i.e. in the radial direction). Such a laser beam is hereinafter called the "radially polarized annular laser beam." Converging the radially polarized annular laser beam can result in a laser beam having a beam diameter smaller than the diffraction limit. This beam can be utilized for a light source of an optical pickup, laser processing apparatus or other devices.

Figure 1:
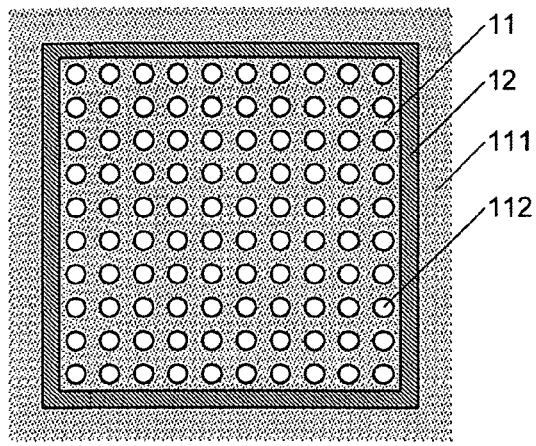
FIGS. 1(a) to 1(c) are illustrations explaining a problem of a conventional surface emitting laser including a two-dimensional photonic crystal with a reflecting member.
Figure 1:
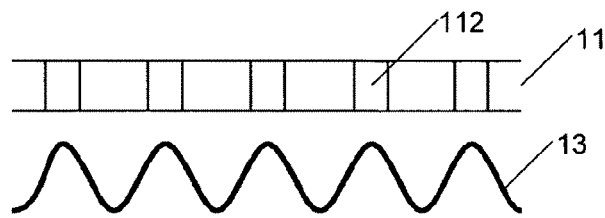
Figure 1:
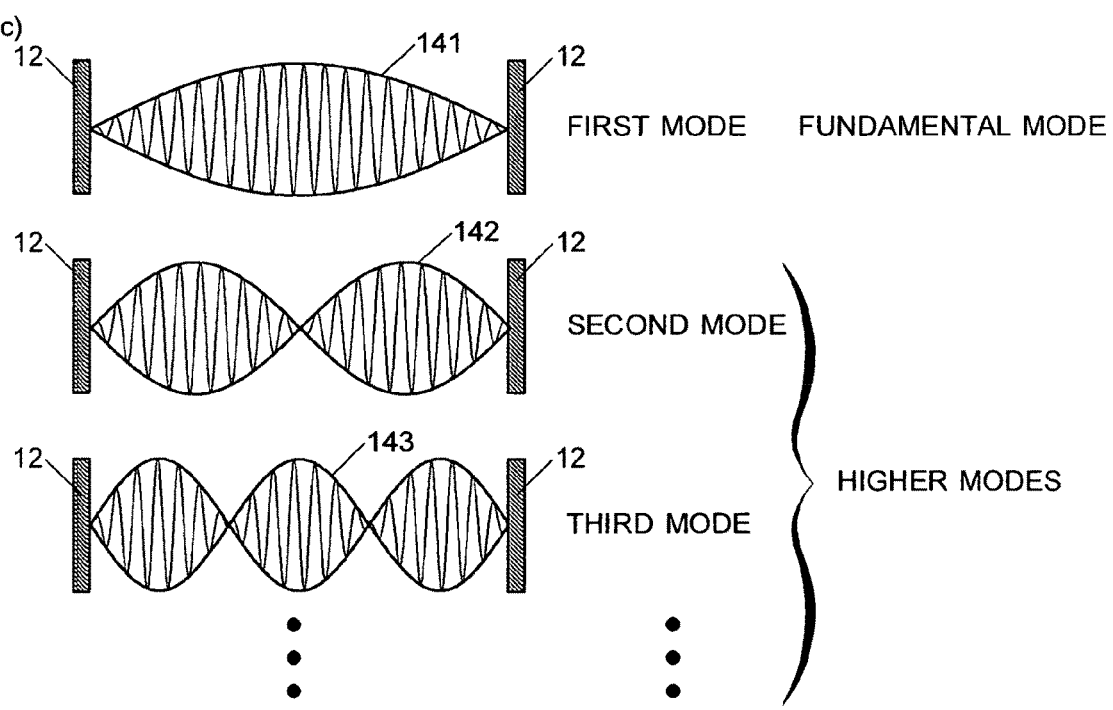

EXPLANATION OF NUMERALS 11, 43 . . . Two-Dimensional Photonic Crystal
111, 41 . . . Body Material
112, 44, 441 . . . Hole
12, 45, 46, 51, 61 . . . Reflector
13 . . . Standing Wave
14 . . . Envelope
141 . . . Fundamental Mode (First Mode)
142 . . . Second Mode
143 . . . Third Mode
31 . . . Substrate
321, 322 . . . Cladding Layer
33 . . . Active Layer
34 . . . Carrier-Blocking Layer
35, 351, 352, 353 . . . Two-Dimensional Photonic Crystal Layer
36 . . . Contact Layer
37 . . . Lower Electrode
38 . . . Upper Electrode
42 . . . Outer Edge of Two-Dimensional Photonic Crystal
48 . . . Curved Portion of Outer Edge
62 . . . Groove

BEST MODES FOR CARRYING OUT THE INVENTION (1) Surface Emitting Laser According to First Aspect of Invention In the surface emitting laser according to the first aspect of the present invention, a two-dimensional photonic crystal is provided on one side of the active layer. A spacer or similar member may also be provided between the active layer and the two-dimensional photonic crystal.

The active layer is a layer that emits light having wavelengths including that of an intended laser light when an electric current is injected into it. This layer may be the same as those conventionally used in conventional Fabry-Perot laser light sources.

As in the conventional surface emitting lasers, the two-dimensional photonic crystal used in the present invention can be created by providing a plate-shaped body material with a periodic arrangement of modified refractive index areas, i.e. the areas whose refractive index differs from that of the body material. The modified refractive index area in the present invention is not limit to any specific shape. The arrangement pattern of the modified refractive index areas may be a square lattice, triangular lattice or any other patterns used in the conventional surface emitting lasers. The modified refractive index areas should preferably consist of holes since this structure provides a large difference in the refractive index between the body and the modified refractive index area and yet is easy to manufacture. However, it is also possible to create the modified refractive index areas by embedding appropriate members into the body. For example, in the case where the two-dimensional photonic crystal needs to be fused to another layer at a high temperature, the modified refractive index area consisting of an embedded member can be suitably used to prevent the high temperature from deforming the modified refractive index area. The modified refractive index area consisting of an embedded member can also be suitably used if the manufacturing process includes creating the two-dimensional photonic crystal and then epitaxially growing another layer.

The two-dimensional photonic crystal is surrounded by a reflector. If the two-dimensional photonic crystal is created only in a portion of the slab, the reflector can be formed in the portion of the slab that surrounds the two-dimensional photonic crystal. If the two-dimensional photonic crystal is created in the entirety of the slab, the reflector can be formed in the circumference of the slab.

The reflector in the surface emitting laser according to the first aspect of the present invention is designed so that it has a reflectance distribution, i.e. the reflectance changes depending on the position within the reflector. The reflectance distribution is created so that it has a maximum value at a position where the amplitude envelope of the fundamental mode, among many modes that can be created in the internal resonance light, has a maximum value.

Figure 2:
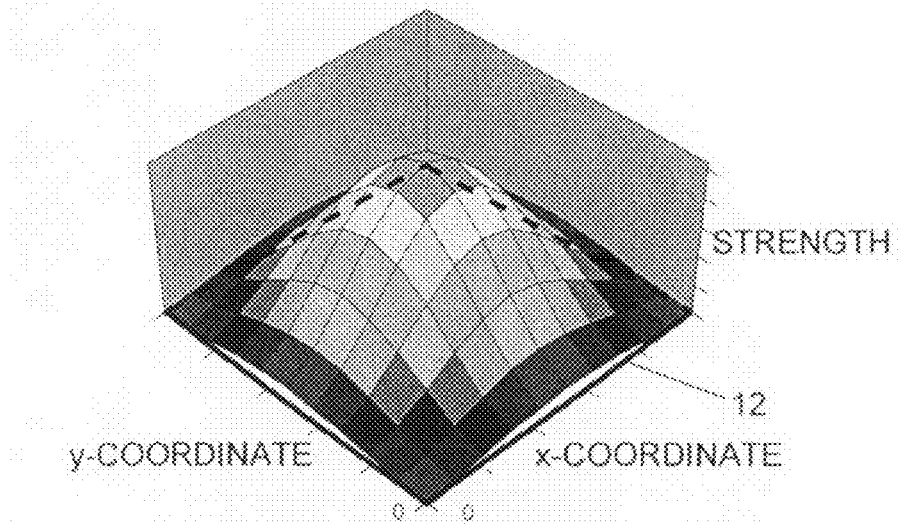
FIGS. 2(a) and 2(b) are graphs each showing the two-dimensional distribution of the amplitude envelope of an internal resonance light in a two-dimensional photonic crystal surface emitting laser light source.
Figure 2:
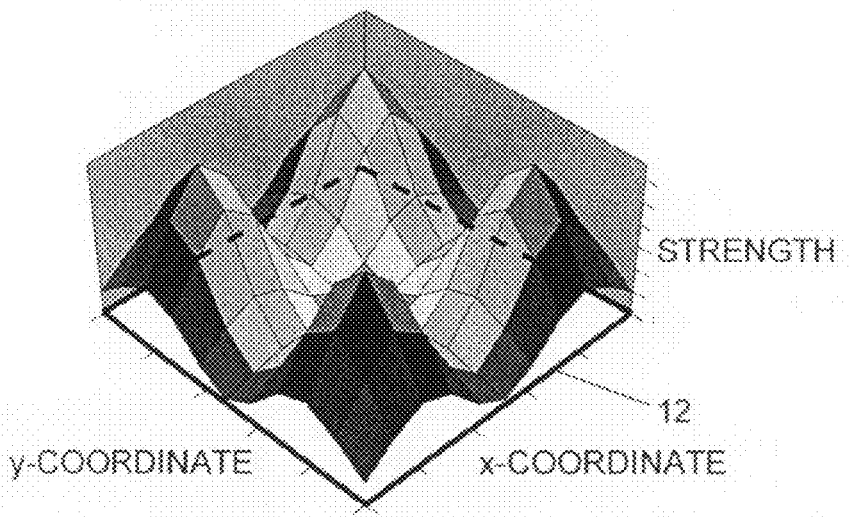

In the previously described example of FIGS. 2(a) and 2(b), the amplitude envelopes of both the fundamental and higher modes have a strength distribution on the reflector 12. In the fundamental mode shown in FIG. 2(a), the envelope has a maximum value in the vicinity of the midpoint of each side of the rectangular reflector 12 and a minimum value in the vicinity of each apex of the rectangle, whereas the envelope in the second mode has a minimum value in the vicinity of the midpoint of each side of the rectangular reflector 12, as shown in FIG. 2(b). In such a case, the reflector in the present invention should have a reflectance distribution in which the reflectance has a maximum value in the vicinity of the midpoint of each side of the rectangle.

Creating such a reflectance distribution increases the reflectance at the position where the fundamental mode has a large amplitude, and a light-confining effect is obtained in an effective manner. On the other hand, the second mode, which is second only to the fundamental mode in ease of creation, has a minimum value at the aforementioned position, so that the light-confining effect for the second mode is small. Furthermore, the present reflectance distribution has low reflectance values at positions where the amplitude of the fundamental mode is small. Due to these features, the confining effect for the second mode is lowered with only minor influence on the light-confining effect for the fundamental mode. This difference in the magnitude of the confining effect enables a selective emission of light in the fundamental mode.

In the previously described example, the two-dimensional photonic crystal with the modified refractive index areas (i.e. holes) arranged in a square lattice pattern was surrounded by a rectangular reflector. However, if the two-dimensional photonic crystal has the modified refractive index areas arranged in a triangular lattice pattern, it is preferable to create the reflector along a hexagonal line surrounding the two-dimensional photonic crystal. The reflectance distribution in this case should also be created so that the reflectance has a maximum value in the vicinity of the midpoint of each side of the hexagon.

The reflector may entirely surround the two-dimensional photonic crystal or be partially provided only at one or more section of a line surrounding the two-dimensional photonic crystal, with each section including a position where the amplitude envelope of the fundamental mode has a maximum value. The latter design increases the amplitude of the fundamental mode at the position where the envelope has the maximum value while suppressing the amplitudes of both the fundamental and higher modes at the positions where no reflector is present. Thus, a fundamental mode with a larger maximum value can be obtained.

The reflector may also be created not only at the outer edge of the two-dimensional photonic crystal but also within the two-dimensional photonic crystal. At the outer edge of the two-dimensional photonic crystal, the light present inside the two-dimensional photonic crystal is reflected. Creating the reflector inside the two-dimensional photonic crystal enables the amplitude of the fundamental mode to be controlled without being influenced by this reflection of light at the outer edge of the two-dimensional photonic crystal.

The outer edge of the two-dimensional photonic crystal may be at least partially curved at a position other than the position where the amplitude envelope of the fundamental mode has a maximum value. In this case, an incident ray of light falling onto the curved portion of the outer edge within the two-dimensional photonic crystal will be reflected at an angle to the incident direction. This leads to a decrease in the reflectance in the opposite direction. The presence of this curved portion in the outer edge enables the laser oscillation in the fundamental mode to be effectively selected.

The reflector may be a dielectric multi-layer film obtained by alternately laminating two types of films having different reflectance parallel to the outer edge, or a diffraction grating obtained by forming a plurality of grooves parallel to the outer edge in the slab immediately external to the two-dimensional photonic crystal. The reflectance can be raised by increasing the number of films (for the dielectric multi-layer film) or grooves (for the diffraction grating). Based on this knowledge, the number of films or grooves should be determined according to the previously described reflectance distribution. The diffraction grating has an advantage over the dielectric multi-layer film in that the former device can be easily created by generally known etching techniques while the latter requires the films to be embedded into the region around the two-dimensional photonic crystal. Such a groove-type diffraction grating is used as a reflector in a distributed Bragg reflector (DBR) laser.

(2) Surface Emitting Laser According to Second Aspect of Invention

The surface emitting laser according to the second aspect of the present invention includes the same active layer and two-dimensional photonic crystal as those used in the first aspect of the present invention. A reflector surrounding the two-dimensional photonic crystal is also provided as in the first aspect of the present invention. In the second aspect of the present invention, the reflector is formed so that the change in the phase of light that occurs when the light is reflected by the reflector is greater than $-0.5\pi$ and less than $0.5\pi$.

Due to the use of a reflector that causes the aforementioned change in the phase of the reflected light, the laser beam emitted from the surface emitting laser according to the second aspect of the present invention becomes a radially polarized annular laser beam.

Figure 3:
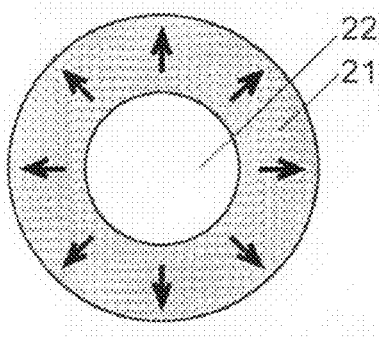
FIG. 3 is an illustration showing the cross section of a radially polarized annular laser beam.

FIG. 3 schematically shows a cross section of the radially polarized annular laser beam. The gray section 21 in FIG. 3 indicates the area where the light is present, and the thick arrows indicate the polarizing direction. This laser beam has an annular cross section with no strength at the central area 22 and is polarized from the center outwards (i.e. in the radial direction).

Generally, it is impossible to generate a laser beam whose spot diameter is equal to or smaller than a diffraction limit decided by the wavelength of the laser beam and the numerical aperture of the focusing lens. However, focusing a radially polarized annular laser beam can result in a laser beam with a spot diameter equal to or smaller than the diffraction limit. This technique is known as the super-resolution method (S. Quabis et al., "Focusing light to a tighter spot", *Optics Communications*, vol. 179, pp. 1-7). Accordingly, it is possible to construct a device capable of generating a super-resolution laser beam by combining a surface emitting laser according to the second aspect of the present invention with a focusing lens for converging the laser beam generated by the surface emitting laser to a diameter equal to or smaller than the diffraction limit. This super-resolution laser beam generator can be used, for example, as a light source for an optical pickup. Use of this light source makes it possible to decrease the spot diameter of the laser beam used for recording (or writing) information into a record medium and playing back (or reading) the information from the record medium, and thereby increase the recording density in the record medium.

The radially polarized laser beam can also be used in the field of laser-beam metal processing as well as in the super-resolution technique. It is known that irradiating a metal with a radially polarized laser beam provides a higher processing rate than in the case where a circularly or linearly polarized laser beam having the same amount of energy is used (V. G. Niziev et al., "Influence of beam polarization on laser cutting efficiency", *Journal of Physics D—Applied Physics*, vol. 32, No. 13, pp. 1455-1461). Thus, the surface emitting laser according to the second aspect of the present invention is suitable as a light source for irradiating a workpiece with light.

Embodiments (1) Embodiment of Surface Emitting Laser According to First Aspect of Invention An embodiment of the surface emitting laser according to the first aspect of the present invention is hereinafter described with reference to FIGS. 4 to 11.

Figure 4:
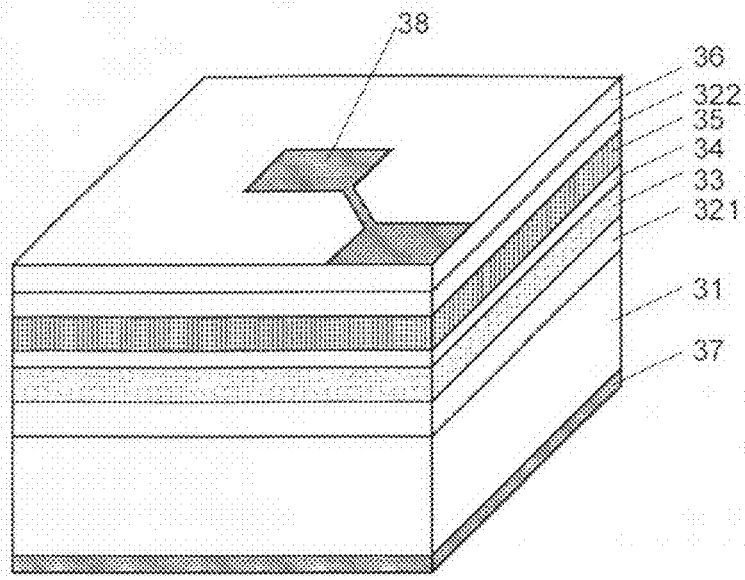
FIG. 4 is a perspective view of a surface emitting laser in the first and second embodiments (the first aspect of the present invention).

FIG. 4 is a perspective view of the laser light source in the present embodiment. This laser light source includes a substrate 31 made of an n-type semiconductor of gallium arsenide (GaAs), on which an active layer 33 made of indium gallium arsenide (InGaAs)/gallium arsenide (GaAs) and having multiple-quantum wells (MQW) is located, with a cladding layer 321 made of an n-type semiconductor of aluminum gallium arsenide (AlGaAs) in between. Provided on this active layer 33 is a two-dimensional photonic crystal layer 35, with a carrier-blocking layer 34 made of AlGaAs in between. The structure of the two-dimensional photonic crystal layer 35 will be later described. On this two-dimensional photonic crystal layer 35, a cladding layer 322 of p-AlGaAs and a contact layer 36 of p-GaAs are provided. A lower electrode 37 is located beneath the substrate 31, and an upper electrode 38 on the contact layer 36.

FIG. 5(a) shows the first example of the two-dimensional photonic crystal layer 35 (the two-dimensional photonic crystal layer 351; the first embodiment) by a plan view. The two-dimensional photonic crystal layer 35 consists of a plate-shaped body material 41 (for example, made of p-GaAs) in which holes 44 are periodically arranged over a rectangular area indicated by the broken line 42 to create a two-dimensional photonic crystal 43, and a reflector 45 surrounding the two-dimensional photonic crystal 43 from four directions is formed in the body material 41. The reflector 45 in this example is created by providing a plurality of grooves for each side of the outer edge (indicated by the broken line 42) of the two-dimensional photonic crystal 43 on the body material 41, with each groove extending substantially parallel to the outer edge. The grooves are designed so that their length decreases as the distance from the two-dimensional photonic crystal 43 increases, and their middle points in the length direction coincide with each other. Forming the grooves in this manner results in a larger number of grooves present at the central portion of each side of the outer edge 42 of the two-dimensional photonic crystal 43 than at the end portions, so that the reflectance is higher at the central portion.

FIG. 5(b) shows the second example of the two-dimensional photonic crystal layer 35 (the two-dimensional photonic crystal layer 352; the second embodiment) by means of a plan view. The structures of the body material 41 and two-dimensional photonic crystal 43 are identical to those of the previous two-dimensional photonic crystal layer 351. The reflector 46 in the present example is formed by providing a plurality of grooves only at the central portion of each side of the outer edge of the two-dimensional photonic crystal 43, with each groove extending parallel to the outer edge. Forming the grooves in this manner causes light to be reflected only at the central portion of each side of the outer edge 42 of the two-dimensional photonic crystal 43.

In this example, a portion of the reflector 46 is located inside the outer edge 42 of the two-dimensional photonic crystal 43. This design causes the standing wave of the internal resonance light to be created within a rectangle including the reflecting plane of the reflector 46, as indicated by the thicker broken line 47 in FIG. 5(b). Thus, an unnecessary reflection of light at the outer edge 42 of the two-dimensional photonic crystal 43 is prevented.

The surface emitting laser in the present embodiment operates as follows: When a voltage is applied between the lower electrode 37 and upper electrode 38 to generate a current between the two electrodes, the electrons and positive holes injected into the device recombine together within the active layer 33 and emit light. Among various components of light generated within the active layer 33, the light having a specific wavelength forms a standing wave within the two-dimensional photonic crystal 43 and is thereby amplified, so that a laser oscillation results. In this process, the fundamental mode in which the amplitude envelope of the standing wave has only a single antinode and the higher modes in which the amplitude envelope has multiple antinodes are created inside the two-dimensional photonic crystal 43, as shown in FIGS. 1(c), 2(a) and 2(b). Among these modes, the fundamental mode has a maximum amplitude in the vicinity of the midpoint of each side of the outer edge 42 of the two-dimensional photonic crystal 43. This is also the point where the reflector 45 or 46 has a maximum reflectance. Thus, in the present embodiment, a larger light-confining effect is obtained at the positions where the fundamental mode has a large amplitude, so that the fundamental mode is more likely to be created.

Figure 7:
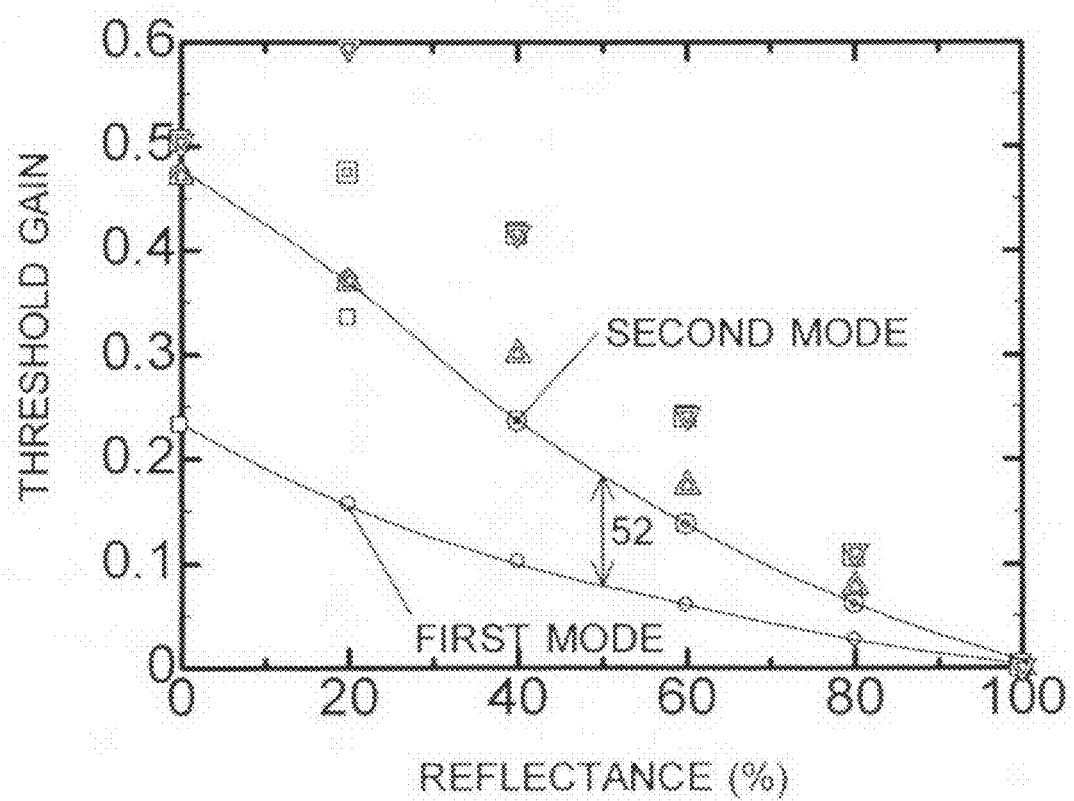
FIG. 7 is a graph showing the calculated result of the threshold gain in the surface emitting laser of the comparative example.
Figure 8:
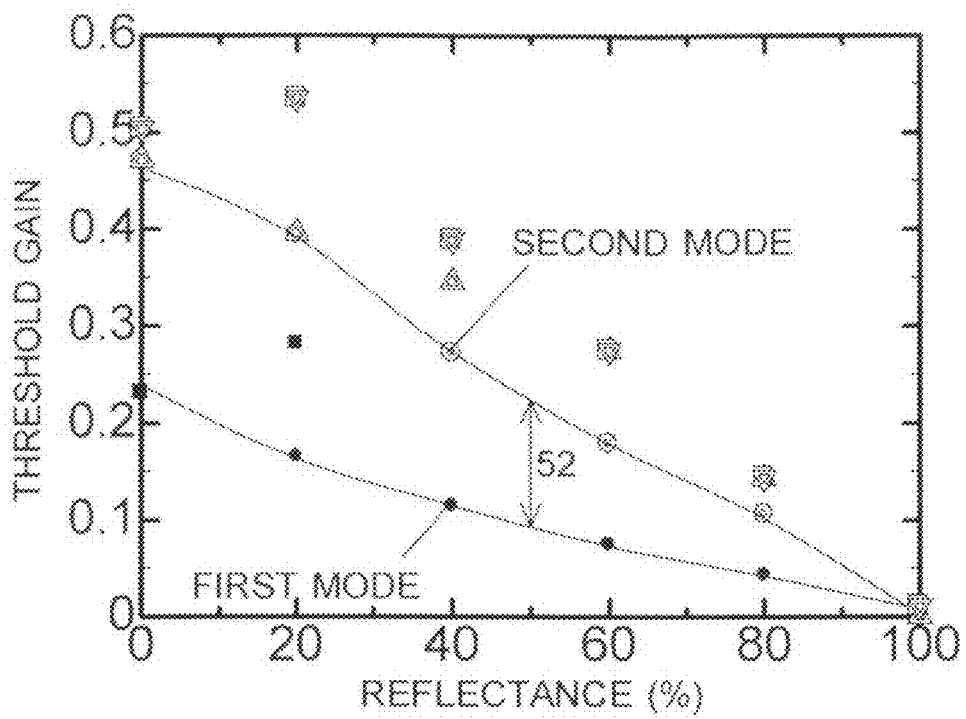
FIG. 8 is a graph showing the calculated result of the threshold gain in the surface emitting laser of the first embodiment.
Figure 9:
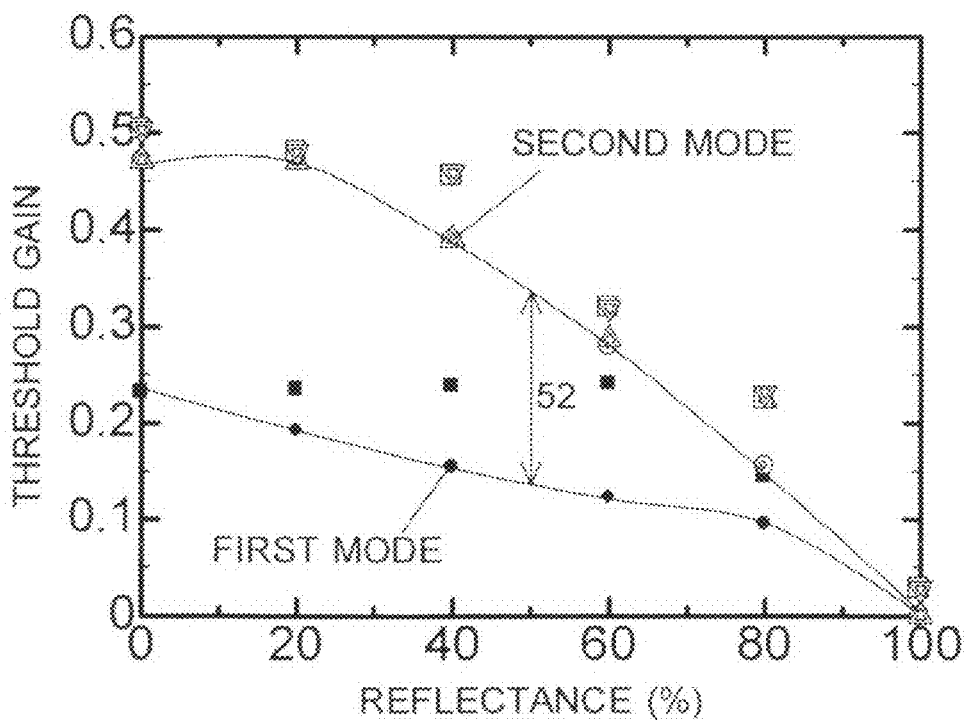
FIG. 9 is a graph showing the calculated result of the threshold gain in the surface emitting laser of the second embodiment.

Calculations were conducted for determining the threshold gains of the surface emitting lasers in the present embodiments and another surface emitting laser as a comparative example (FIG. 6) in which a reflector 51 having an evenly distributed reflectance was provided along the outer edge 42 of the two-dimensional photonic crystal 43. The results were as shown in FIGS. 7 to 9. Specifically, FIG. 7 shows the result for the comparative example, FIG. 8 for the first embodiment, and FIG. 9 for the second embodiment. In these figures, the single white or black circles indicate the threshold gain in the fundamental mode, and the double circles indicate that in the second mode. The double triangles, double squares and inversed double triangles each indicate the threshold gain in the third or higher modes. The single black or white squares indicate the threshold gain in the fundamental mode with a polarizing direction different from that of the fundamental mode indicated by the single white or black circles (but with the same wavelength). The horizontal axis in FIG. 7 indicates the reflectance of the reflector (the value is the same for every position), and that in FIG. 8 or 9 indicates the maximum value of the reflectance.

The calculations assumed that the phase of light changes by $\pi$ (i.e. the phase is inverted) when the light is reflected at the reflector.

In any of the comparative example, the first embodiment and the second embodiment, the threshold gain in the first mode (indicated by the single white or black circles) decreases as the reflectance increases. This is favorable for an efficient emission of laser light. However, the increase in the reflectance also decreases the threshold gain in the second mode, with the result that the difference in the threshold gain between the fundamental mode and the second mode (as indicated by the gap 52 in FIGS. 7 to 9) decreases. The decrease in this difference raises the probability that the unwanted second mode exceeds the threshold and causes a laser oscillation as well as the fundamental mode.

Figure 10:
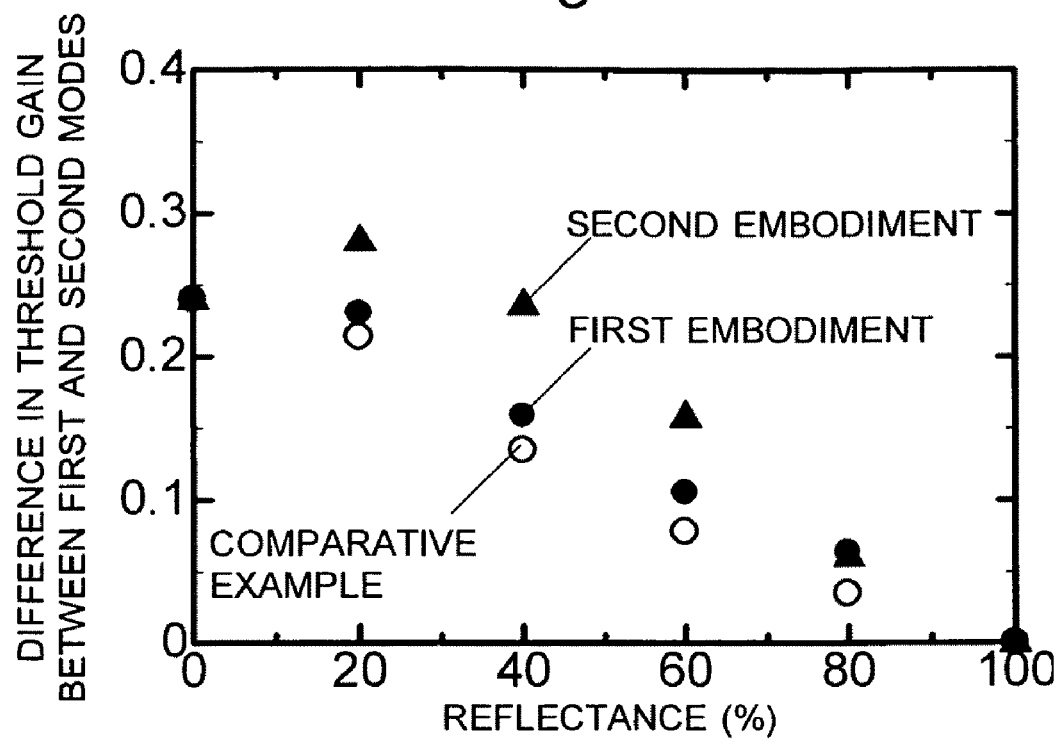
FIG. 10 is a graph showing the calculated result of the difference between the threshold gain of the first mode and that of the second mode in the surface emitting lasers of the comparative example, first embodiment and second embodiment.

FIG. 10 is a graph showing the calculated result of the difference between the threshold gain of the first mode and that of the second mode for the comparative example, the first embodiment and the second embodiment. This graph demonstrates that the difference in the threshold gain in the first and second embodiments is larger than that in the comparative example. This means that the devices in these embodiments can more effectively suppress unnecessary laser oscillations due to the second mode than the device in the comparative example. Thus, the present embodiments are more suited for generating a laser oscillation composed of only the fundamental mode. The difference in the threshold gain is particularly large in the second embodiment. This is because the reflector is present only in the vicinity of the position where the amplitude envelope of the fundamental mode has a maximum value, so that the effect of the present invention is more clearly obtained.

Figure 11:
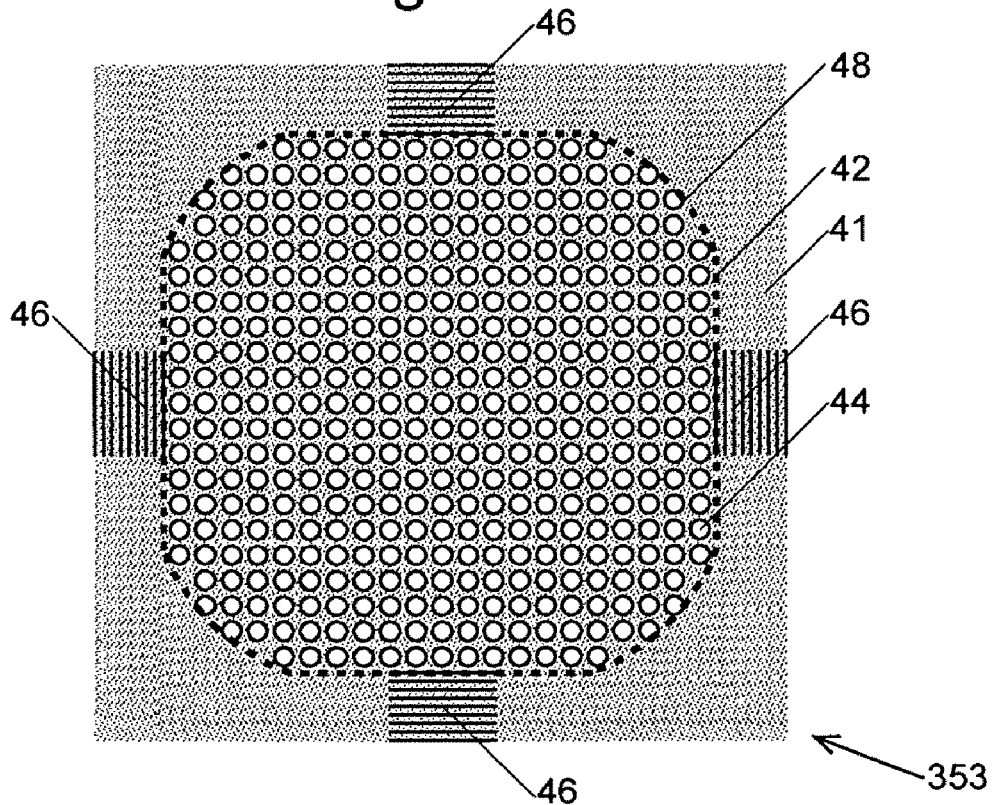
FIG. 11 is a plan view of the two-dimensional photonic crystal layer 35 in the surface emitting laser of the third embodiment (the first aspect of the present invention).

Another embodiment of the surface emitting laser according to the first aspect of the present invention (the third embodiment) is hereinafter described with reference to FIG. 11. The structure of the surface emitting laser in the third embodiment is identical to that of the first and second embodiments except for the two-dimensional photonic crystal layer 353. As shown in FIG. 11, the two-dimensional photonic crystal layer 353 consists of a body material 41 in which holes 44 are arranged in a square lattice pattern. Its outer edge 42 has a curved portion 48 formed by omitting the holes 44 at around each corner of the rectangle. The reflector 46 is provided only in the vicinity of the midpoint of the straight section of the outer edge 42, as in the second embodiment.

At the curved section 48, the outer edge 42 obliquely intersects the square lattice of the two-dimensional photonic crystal, so that rays of light propagating along the square lattice are obliquely reflected by the outer edge 42. Therefore, at the curved section 48, the reflectance in the opposite direction is equivalently reduced by a significant amount. On the other hand, the fundamental mode, whose amplitude envelope has a maximum value in the vicinity of the midpoint of the straight section that is remote from the curved section 48, can be effectively confined by the reflector 46. Due to these effects, the laser oscillation in the fundamental mode is effectively selected by the surface emitting laser in the third embodiment.

Figure 12:
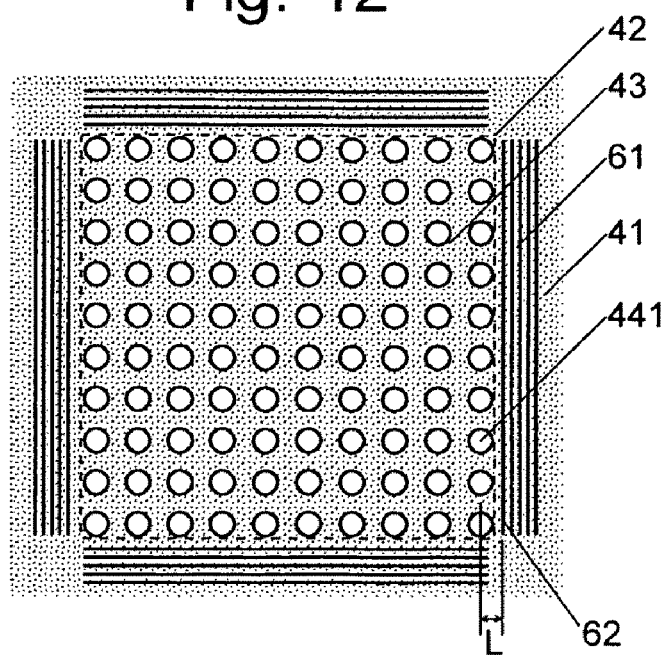
FIG. 12 is a plan view of the two-dimensional photonic crystal layer 35 in the surface emitting laser of the fourth embodiment (the second aspect of the present invention).
Figure 13:
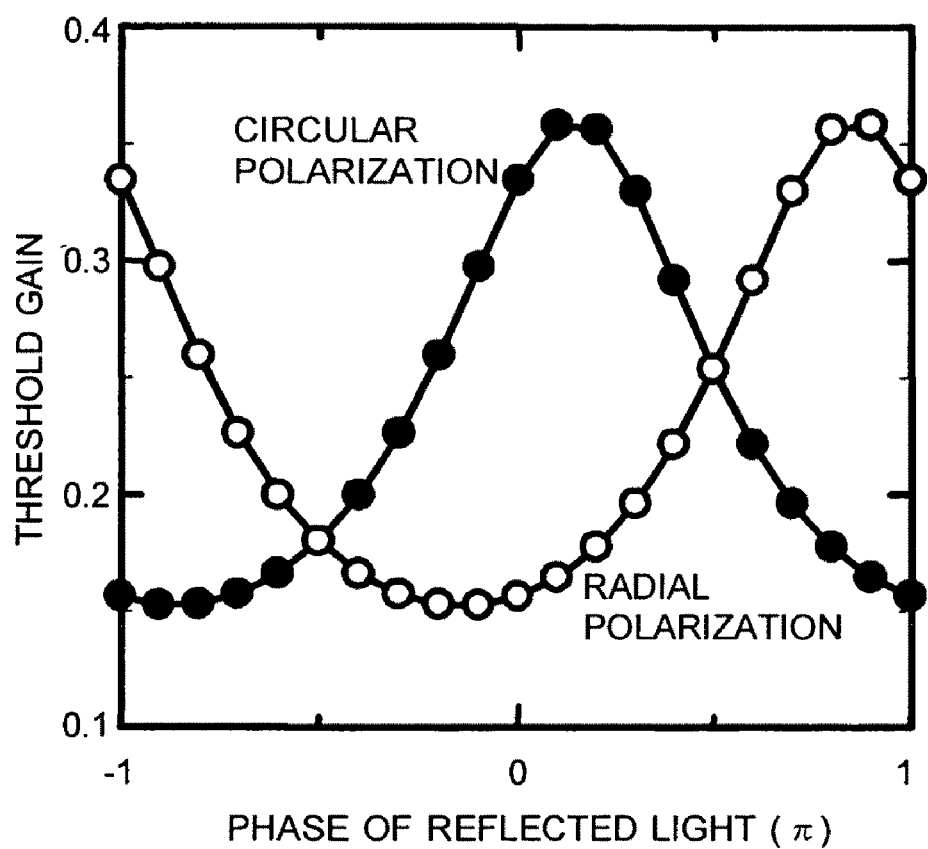
FIG. 13 is a graph showing the calculated result of the relationship between the change in phase due to the reflection at the reflector and the threshold gain, for a mode that generates a radially polarized annular laser beam and a mode that generates a circularly polarized annular laser beam.

(2) Embodiment of Surface Emitting Laser According to Second Aspect of Invention An embodiment of the surface emitting laser according to the second aspect of the present invention (the fourth embodiment) is hereinafter described with reference to FIGS. 12 and 13.

The structure of the surface emitting laser in the fourth embodiment is identical to that of the surface emitting laser according to the first aspect of the present invention shown in FIG. 4 (the first and second embodiments) except for the configuration of the reflector created in the two-dimensional photonic crystal layer 35. FIG. 12 shows a plan view of the two-dimensional photonic crystal layer 35 in the present embodiment. The reflector 61 in this embodiment consists of a plurality of grooves provided at each side of the outer edge 42 of the two-dimensional photonic crystal 43. These grooves are parallel to the outer edge 42 and identical in length. The distance L between the centers of the holes 441 closest to the outer edge 42 and the groove 62 closest to these holes is $(n/2-\frac{1}{8})$ to $(n/2+\frac{1}{8})$ times the wavelength of light to be emitted, where n is an integer. A negative value of L indicates that the groove 62 is closer to the center of the two-dimensional photonic crystal 43 than the holes 441. Conversely, a positive value of L indicates that the groove 62 is farther from the two-dimensional photonic crystal 43 than the holes 441.

In the surface emitting laser in the present embodiment, when a voltage is applied between the lower electrode 37 and the upper electrode 38, a standing wave is formed within the two-dimensional photonic crystal 43 and the light is thereby amplified, as in the first aspect of the present invention, so that a laser oscillation results. The standing wave thereby formed has an antinode at the center of each hole 44 (this antinode is different from the antinode of the amplitude envelope). Therefore, the phase of light at the reflector 61 can be set within a range of $-0.5\pi$ to $0.5\pi$ by making the distance between the holes 441 and the groove 62 be $(n/2-\frac{1}{8})$ to $(n/2+\frac{1}{8})$ times the wavelength of light.

The threshold gain of a mode that generates a radially polarized annular laser beam was calculated for the case where the change in the phase of light due to the reflection by the reflector 61 was within a range of 0 to $0.5\pi$ and a reference case where the change in phase was within a range of $0.5\pi$ to $\pi$. The calculation was also performed for the threshold gain of a mode that generates a circularly polarized annular laser beam in which the polarizing direction at a cross section of the laser beam is perpendicular to the radial polarization. The results are as shown in FIG. 13, which shows that within the range of $-0.5\pi$ to $0.5\pi$ the threshold gain of the radially polarized light is smaller than that of the circularly polarized light, and accordingly the former light is easier to generate.

It should be noted that the materials used for the active layer or two-dimensional photonic crystal layer in each embodiment of the first or second aspect of the present invention are mere examples; it is possible to make these materials from various materials used in the conventional two-dimensional photonic crystal surface emitting laser light sources.

Figure 5:
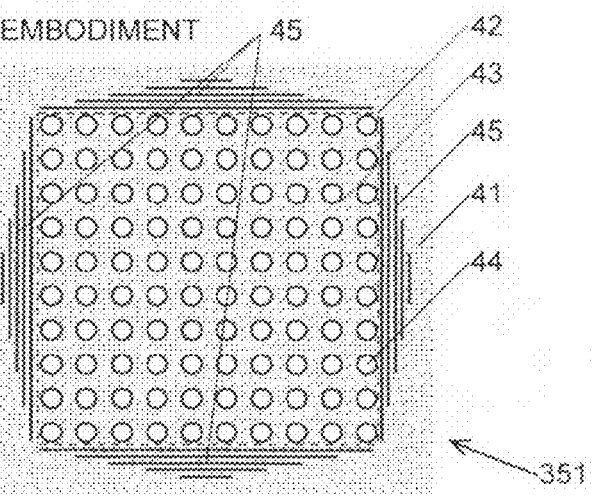
FIGS. 5(a) and 5(b) are plan views showing the two-dimensional photonic crystal layer 35 in the surface emitting laser in the first and second embodiments.
Figure 5:
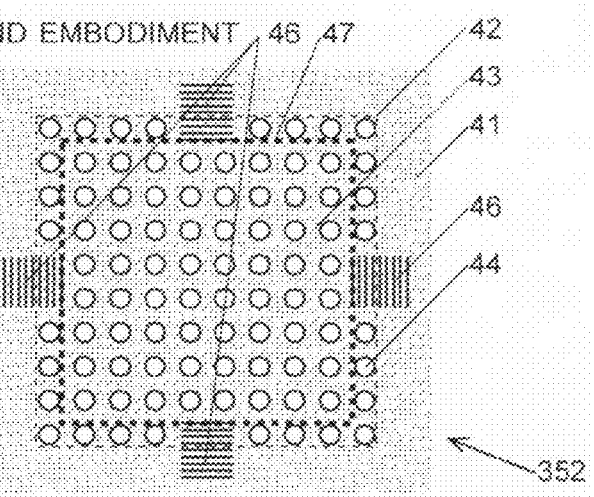
Figure 6:
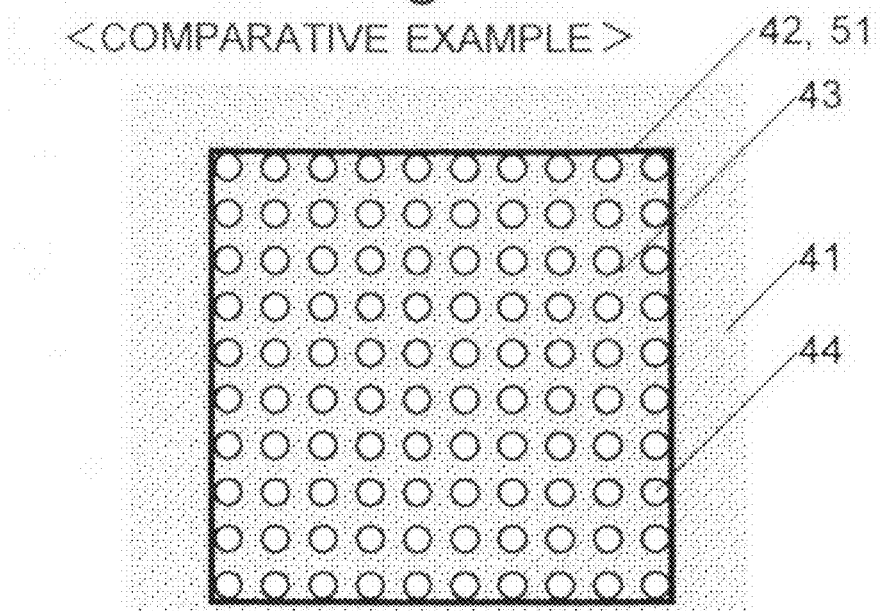
FIG. 6 is a plan view of the two-dimensional photonic crystal layer 35 in a comparative example.

The shape and arrangement pattern of the hole are not limited to those of the two-dimensional photonic crystal layer 35 shown in FIGS. 5(*a*) and 5(*b*), in which the hole was circular and arranged in a square lattice pattern. The hole may be replaced by a member whose refractive index differs from that of the body material.

The invention claimed is:

1. A two-dimensional photonic crystal surface emitting laser light source, comprising:
   a) an active layer;
   b) a two-dimensional photonic crystal provided on one side of the active layer; and
   c) a reflector provided at least at a portion of a circumference of the two-dimensional photonic crystal, the reflector having a non-uniform reflectance distribution in which a reflectance has a maximum value at a position where an amplitude envelope of a fundamental mode of an internal resonance light created within the two-dimensional photonic crystal has a maximum value.

2. The two-dimensional photonic crystal surface emitting laser light source according to claim 1, wherein the reflector is created by providing a member for reflecting the internal resonance light only at one or more sections of a line surrounding the two-dimensional photonic crystal, each section including a position where the amplitude envelope of the fundamental mode has a maximum value.

3. The two-dimensional photonic crystal surface emitting laser light source according to claim 1, wherein a portion of the reflector is located inside an outer edge of the two-dimensional photonic crystal.

4. The two-dimensional photonic crystal surface emitting laser light source according to claim 1, wherein the two-dimensional photonic crystal has an outer edge that is at least partially curved at a position other than the position where the amplitude envelope of the fundamental mode has a maximum value.

5. The two-dimensional photonic crystal surface emitting laser light source according to claim 1, wherein:
   the two-dimensional photonic crystal is a slab-shaped body in which a plurality of areas whose refractive index differs from that of the body are arranged in a square lattice pattern;
   the reflector is provided along a rectangle surrounding the two-dimensional photonic crystal; and
   the reflectance distribution has a maximum value at a central portion of each side of the rectangle.

6. The two-dimensional photonic crystal surface emitting laser light source according to claim 1, wherein:
   the two-dimensional photonic crystal is created in a slab-shaped member;
   the reflector includes a plurality of grooves parallel to an outer edge of the two-dimensional photonic crystal; and
   the reflectance distribution is created by changing the number of the grooves.

7. A two-dimensional photonic crystal surface emitting laser light source, comprising:
   a) an active layer;
   b) a two-dimensional photonic crystal provided on one side of the active layer; and
   c) a reflector provided at least at a portion of a circumference of the two-dimensional photonic crystal, the reflector being formed so that a change in a phase of light that occurs when the light is reflected by the reflector is greater than $-0.5\pi$ and less than $0.5\pi$ and a threshold gain of radially polarized light is smaller than that of circularly polarized light.

8. A super-resolution laser beam generator, comprising:
   the two-dimensional photonic crystal surface emitting laser light source according to claim 7; and
   a condenser lens for converging a laser beam generated by the two-dimensional photonic crystal surface emitting laser light source to a diameter equal to or smaller than a diffraction limit.

9. An optical pickup, wherein the super-resolution laser beam generator according to claim 8 is provided as a light source.

10. A laser-processing apparatus, wherein the two-dimensional photonic crystal surface emitting laser light source according to claim 7 is provided as a light source for irradiating a workpiece with light.

11. The two-dimensional photonic crystal surface emitting laser light source according to claim 1, wherein the reflector is created by providing a member for reflecting the internal resonance light only at a single portion of each side of the two-dimensional photonic crystal, and each portion where the reflector is disposed corresponds to a position where the amplitude envelope of the fundamental mode of the internal resonance light has the maximum value.

12. The two-dimensional photonic crystal surface emitting laser light source according to claim 11, wherein the reflector is created at a center of each side of the two-dimensional photonic crystal.

13. The two-dimensional photonic crystal surface emitting laser light source according to claim 7, wherein the reflector is a plurality of grooves parallel to an outer edge of the two-dimensional photonic crystal.

14. The two-dimensional photonic crystal surface emitting laser light source according to claim 13, wherein the two-dimensional photonic crystal is a plate-shaped body material in which a plurality of holes are periodically arranged, and
   a distance between a center of the holes nearest to the outer edge of the two-dimensional photonic crystal and the grooves nearest to the outer edge of the two-dimensional photonic crystal is $(n/2-1/8)$ to $(n/2+1/8)$ times a wavelength of emitted light where n is an integer.

* * * * *